US008620486B2

(12) United States Patent
Cheng

(10) Patent No.: US 8,620,486 B2
(45) Date of Patent: Dec. 31, 2013

(54) EXPANDABLE DATA CENTER

(75) Inventor: Bruce C. H. Cheng, Taoyuan Hsien (TW)

(73) Assignee: Delta Electronics, Inc., Taoyuan Hsien (TW)

(*) Notice: Subject to any disclaimer, the term of this patent is extended or adjusted under 35 U.S.C. 154(b) by 547 days.

(21) Appl. No.: 12/836,584

(22) Filed: Jul. 15, 2010

(65) Prior Publication Data
US 2012/0013141 A1 Jan. 19, 2012

(51) Int. Cl.
G05D 23/00 (2006.01)

(52) U.S. Cl.
USPC .......................... 700/299; 700/276; 700/300

(58) Field of Classification Search
USPC .......................... 700/276, 299, 300
See application file for complete search history.

(56) References Cited

U.S. PATENT DOCUMENTS

| 6,862,179 | B2 | 3/2005 | Beitelmal et al. |
| 7,046,514 | B2 | 5/2006 | Fink et al. |
| 7,051,946 | B2 | 5/2006 | Bash et al. |
| 7,106,590 | B2 | 9/2006 | Chu et al. |
| 7,339,490 | B2 | 3/2008 | Moore et al. |
| 7,383,691 | B2 | 6/2008 | Felcman et al. |
| 7,447,920 | B2 | 11/2008 | Sharma et al. |
| 7,463,950 | B1 | 12/2008 | Brey et al. |
| 7,493,193 | B2 | 2/2009 | Hyland et al. |
| 7,543,060 | B2 | 6/2009 | Ishida et al. |
| 7,551,971 | B2 | 6/2009 | Hillis |
| 7,630,795 | B2 | 12/2009 | Campbell et al. |
| 7,640,344 | B2 | 12/2009 | Kokusho et al. |
| 2003/0029390 | A1* | 2/2003 | Campion ........................ 123/2 |
| 2006/0047808 | A1 | 3/2006 | Sharma et al. |
| 2007/0258212 | A1 | 11/2007 | Malone et al. |
| 2008/0060790 | A1 | 3/2008 | Yates et al. |
| 2008/0094799 | A1 | 4/2008 | Zieman et al. |
| 2008/0123288 | A1 | 5/2008 | Hillis |
| 2009/0150123 | A1 | 6/2009 | Archibald et al. |
| 2009/0150129 | A1 | 6/2009 | Archibald et al. |
| 2009/0150133 | A1 | 6/2009 | Archibald et al. |
| 2009/0229194 | A1 | 9/2009 | Armillas |
| 2009/0305625 | A1* | 12/2009 | Dawson et al. ............... 454/184 |
| 2010/0139887 | A1* | 6/2010 | Slessman ........................ 165/67 |
| 2011/0155674 | A1* | 6/2011 | Knight et al. .................. 211/26 |
| 2011/0157829 | A1* | 6/2011 | Wormsbecher et al. ...... 361/701 |

OTHER PUBLICATIONS

Exhibit 1 (color photos) & its brief English translation.

* cited by examiner

Primary Examiner — Mohammad Ali
Assistant Examiner — Nathan Laughlin
(74) Attorney, Agent, or Firm — CKC & Partners Co., Ltd.

(57) ABSTRACT

An expandable data center is provided. The expandable data center includes a first movable container, a second movable container coupling with the first movable container, and a plurality of racks disposed within the first movable container and the second movable container. The size of the second movable container is less than that of the first movable container, so that the second movable container can be moved into the first movable container when a vehicle carries the first movable container and the second movable container from a place to another place. A plurality of sensors and/or detectors are disposed within the first movable container and the second movable container, respectively, for sensing and/or detecting one or more environmental parameters in the first and the second movable containers. A method for deploying a data center is also provided.

18 Claims, 14 Drawing Sheets

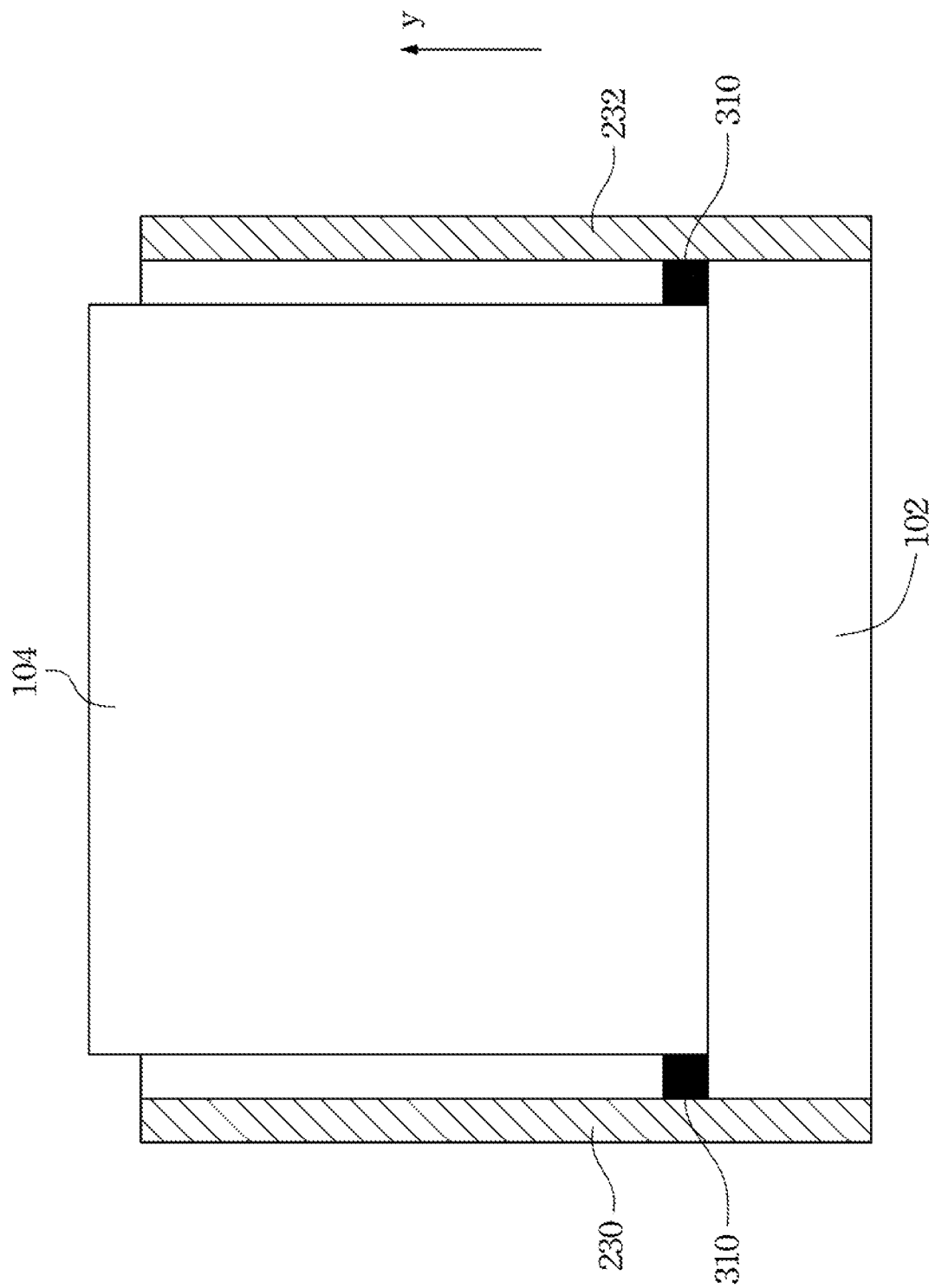

EXPANDABLE DATA CENTER

BACKGROUND

1. Field of Invention

The present invention relates to a data center. More particularly, the present invention relates to a transportable, expandable data center.

2. Description of Related Art

Data centers are normally housed in conventional building structures, which generally require a substantial amount of space in an office building or manufacturing facility. Normally, the number of fixed data centers to be installed in a given area is limited according to applicable building rules and security regulations. However, when there is demand for expansion of data storage and/or processing capacity but the fixed data centers do not allow room for such expansion, movable data centers may be used to provide for additional room.

Building a new data center or expanding an existing one requires substantial time and resources. Architectural plans generally must be created to incorporate all of the necessary features and comply with local building codes. Data processing operations must continue without interruption if a new or expanded data center is to replace or is to be integrated into an existing data center. U.S. Pat. Pub. No. 2008/0060790 published on Mar. 13, 2008 discloses a movable data center that comprises a portable container for an operable computer system to address the problem associated with expansion of data centers. Moreover, U.S. Pat. Pub. No. 2009/0229194 published on Sep. 17, 2009 discloses a modular containment structure that provides practical and efficient mobility as it can be quickly deployed.

Data centers are designed to provide a controlled environment for efficient operations of computer systems. It is known that computers operate more effectively when they are properly cooled. Conventional data centers are typically cooled by operation of one or more air conditioning units. Air conditioning units for conventional data centers do not vary their cooling fluid output based on respective needs of the distributed data centers. Instead, these air conditioning units generally operate at or near a maximum compressor power even when the heat load is relatively low inside the data center. U.S. Pat. No. 7,493,193 discloses a computer program product for monitoring and real-time heat load control based upon server and environmental parameters to solve the cooling problem.

SUMMARY

According to one aspect of the present invention, there is provided an expandable data center, which comprises a first movable container, a second movable container coupling with the first movable container, and a plurality of movable racks disposed within the first movable container and the second movable container. The size of the second movable container is less than that of the first movable container such that the second movable container can be moved into the first movable container. The racks are movable between the first movable container and the second movable container. When the second movable container is moved into the first movable container, the racks are aggregated in the second movable container.

According to an embodiment of the present invention, a plurality of sensors and/or detectors are disposed within the first movable container and the second movable container, respectively, for sensing and/or detecting environmental conditions in the first and the second movable containers.

According to another embodiment of the present invention, the first movable container has a movable ceiling and a movable floor. The ceiling and the floor are moved based on the environmental conditions sensed or detected by the sensors or detectors.

According to still another embodiment of the present invention, the second movable container has a movable ceiling and a movable floor. The ceiling and the floor are moved based on environmental conditions sensed or detected by the sensors or detectors. The top wall may comprise a lid covering an opening formed in the top wall that facilitates convection between the interior of the movable container and the environment outside the movable container.

According to another still embodiment of the present invention, a plurality of rails are disposed within the first movable container and the second movable container, respectively, for sliding the racks.

According to another aspect of the present invention, there is provided a method for deploying a data center. The method includes forming a first movable container. Then, a second movable container coupling with the first movable container is formed. The size of the second movable container is less than that of the first movable container such that the second movable container can be moved into the first movable container. Next, a plurality of racks are disposed within the first movable container and the second movable container. The racks are movable between the first movable container and the second movable container. When the second movable container is moved into the first movable container, the racks are aggregated in the second movable container.

According to an embodiment of the present invention, the method further comprises disposing a plurality of sensors and/or detectors within the first movable container and the second movable container, respectively, for sensing and/or detecting environmental conditions in the first and the second movable containers.

According to another embodiment of the present invention, the first movable container has a movable ceiling and a movable floor. The method further comprises adjusting the ceiling and/or the floor based on environmental conditions sensed or detected by the sensors or detectors.

According to still another embodiment of the present invention, the second movable container has a movable ceiling and a movable floor. The method further comprises adjusting the ceiling and/or the floor based on environmental conditions sensed or detected by the sensors or detectors.

According another still embodiment of the present invention, a plurality of rails are disposed within the first movable container and the second movable container, respectively, for moving the racks. The method further comprises adjusting the distance between two adjacent racks based on one or more environmental conditions sensed or detected by the sensors or detectors.

According to another aspect of the present invention, there is provided an expandable data center which comprises a first container and at least one second container. The first container is transportable by a vehicle. The at least one second container, which is smaller in dimension than the first container, is slidably connected with the first container, wherein the second container is adapted to be slid into or out from the first container. A plurality of computer modules are disposed within at least one of the first and second containers. A plurality of sensors or detectors are disposed within at least one of the first and second containers, for sensing or detecting one or more environmental parameters associated with the first and second containers, respectively.

According to another aspect of the present invention, there is provided an expandable data center to be transported by a vehicle. The expandable data center comprises a first container and a second container. The second container, which is smaller in dimension than the first container, is horizontally slidably connected with a lateral side of the first container, wherein the second container is adapted to extend outwardly from the first container. A plurality of computer modules are disposed within at least one of the first and second containers.

According to another aspect of the present invention, there is provided an expandable data center to be transported by a vehicle. The expandable data center comprises a first container and a second container. The second container, which is smaller in dimension than the first container, is vertically slidably connected with an upper side of the first container, wherein the second container is adapted to extend outwardly from the first container. A plurality of computer modules are disposed within at least one of the first and second containers.

According an embodiment of the present invention, a plurality of racks are disposed within the first and second containers for securing the plurality of computer modules.

According another embodiment of the present invention, each of the racks includes a plurality of rack shelves.

According still another embodiment of the present invention, each of the rack shelves comprises a chassis, wherein the chassis is controlled to move up or down based on at least one of the environmental parameters sensed by the sensors.

According another still embodiment of the present invention, a support leg is pivotally connected with the at least one second container for upholding thereof.

According to still another aspect of the present invention, there is provided a method for deploying a data center, which contains one or more computer modules. The method includes transporting a first container, which accommodates at least one second container smaller in dimension than the first container, wherein the at least one second container is slidably connected with the first container. Then, the first container is installed at a predetermined geographic location. Next, the at least one second container is slid into the first container when a first total volume of the first and second containers is needed. The at least one second container is slid out from the first container when a second total volume of the first and second container is needed. A plurality of sensors and/or detectors are disposed within the first and second containers to sense and/or detect one or more environmental parameters associated with the first and second containers, respectively.

According to an embodiment of the present invention, the method further comprises upholding the at least one second container when the at least one second container is slid out from the first container.

According to another embodiment of the present invention, the method further comprises sliding the at least one second container out from the first container comprises sliding horizontally or vertically the at least one second container out from the first container.

BRIEF DESCRIPTION OF THE DRAWINGS

The present invention can be more fully understood by reading the following detailed description of the embodiments, with reference made to the accompanying drawings, where:

FIG. 7 illustrates a cross-sectional view of a smaller container slid vertically within a larger container according to an embodiment of the present invention;

DETAILED DESCRIPTION

Figure 1:
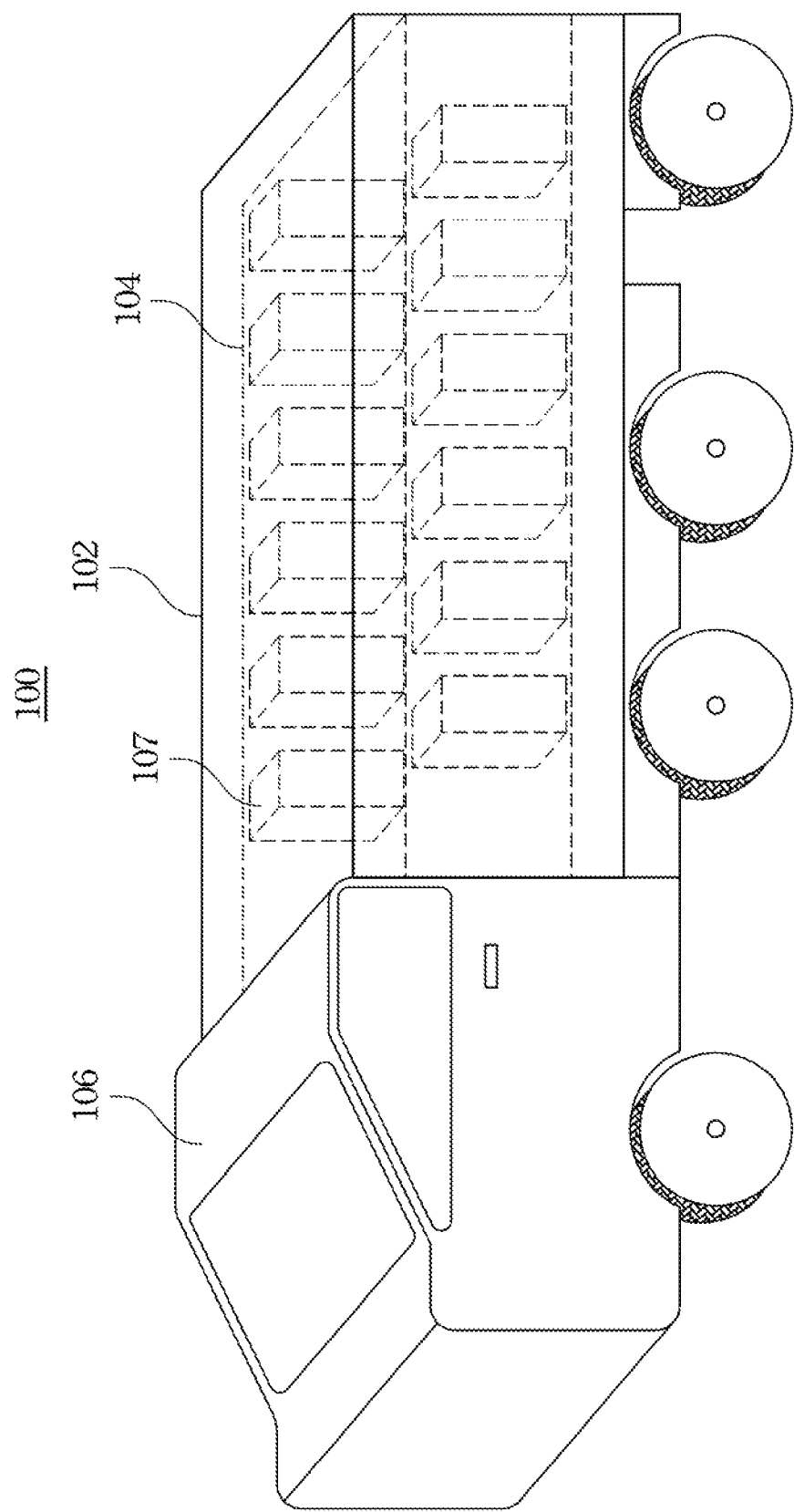
FIG. 1 illustrates an expandable data center according to a preferred embodiment of the present invention.
Figure 2:
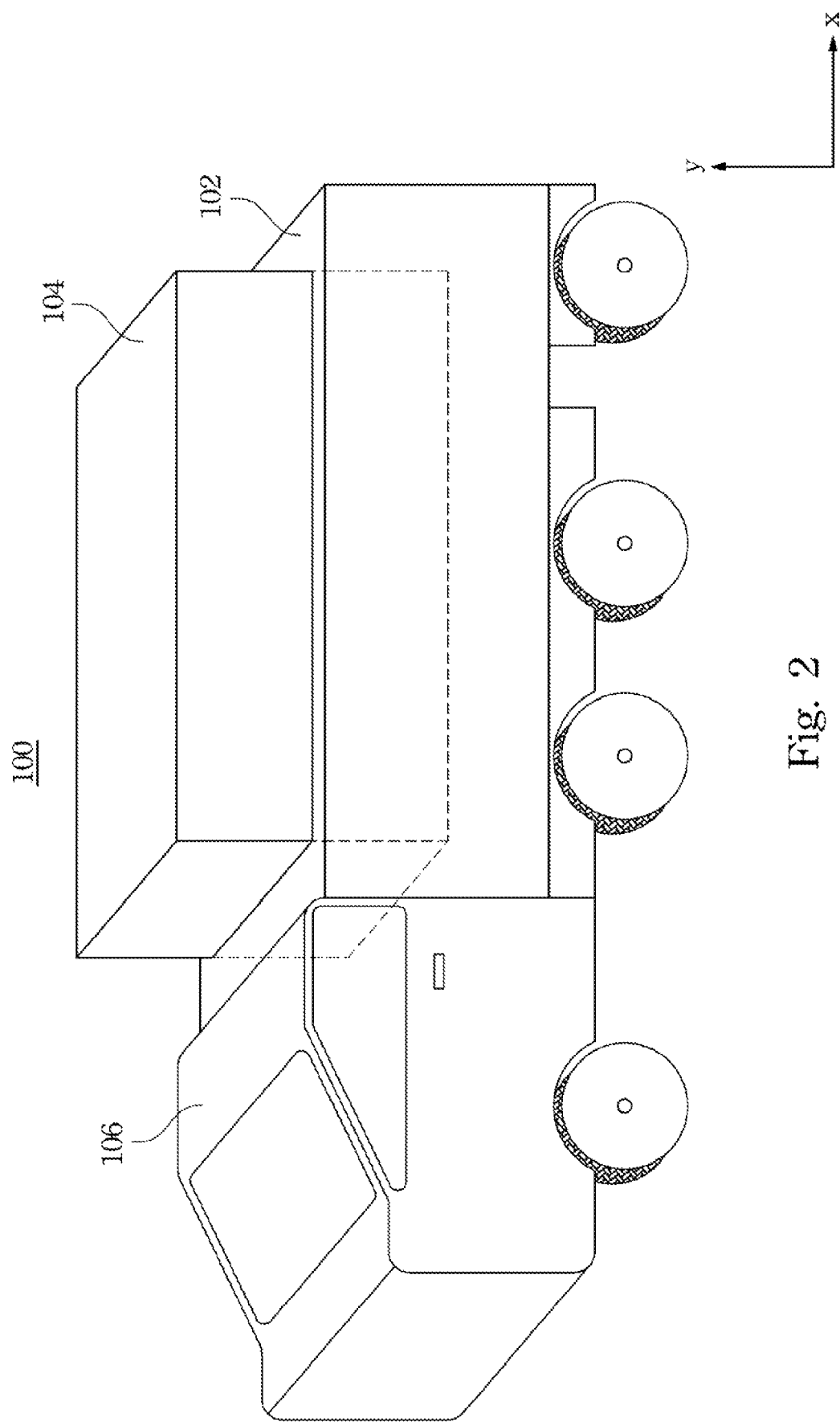
FIG. 2 illustrates an expandable data center with two containers, according to an embodiment of the present invention, wherein a smaller container is slid vertically out from a bigger container.
Figure 3:
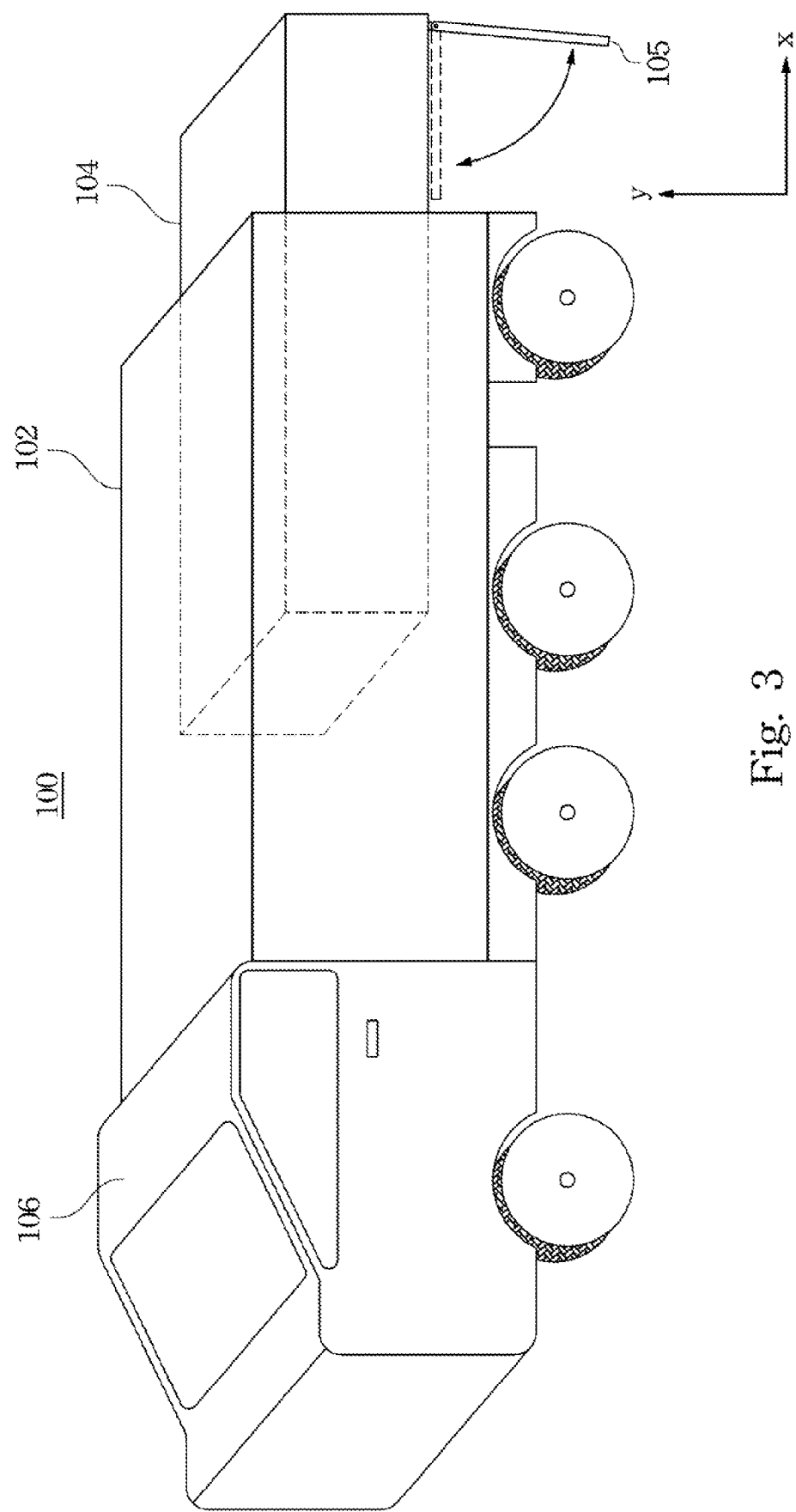
FIG. 3 illustrates an expandable data center with two containers, according to an embodiment of the present invention, wherein a smaller container is slid horizontally out from a rear side of a bigger container.
Figure 4:
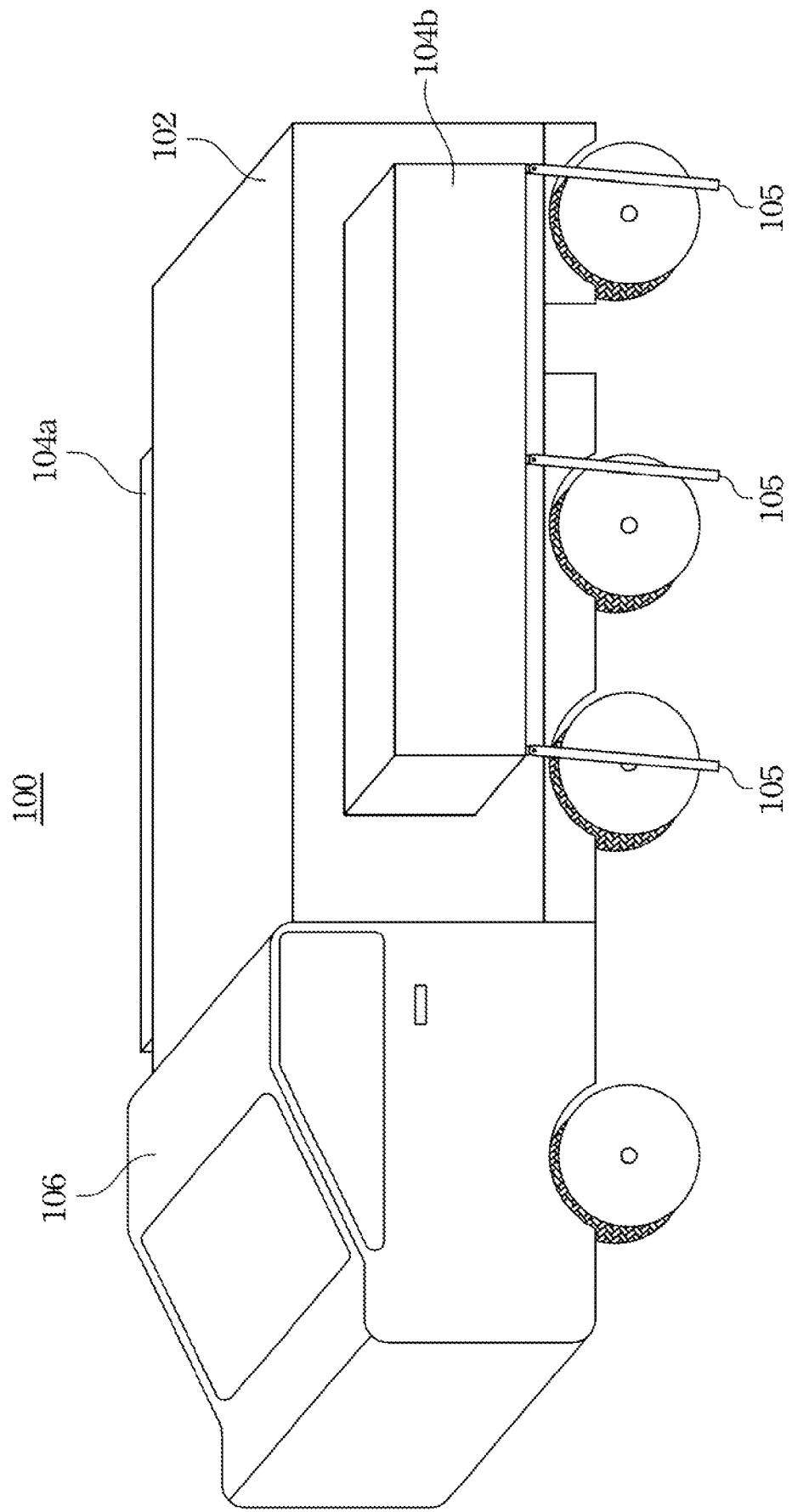
FIG. 4 illustrates an expandable data center with three containers, according to an embodiment of the present invention, wherein two smaller containers are slid horizontally out from two lateral sides of a bigger container.

FIG. 1 illustrates an expandable data center according to a preferred embodiment of the present invention. The expandable data center 100 includes two movable containers 102 and 104, and the smaller container 104 can be moved in and out of the larger container 102. For example, the container 104 is slid into or out from the container 102. There are a plurality of computer modules 107 installed within the movable containers 102 and 104. Although FIG. 1 show two containers, it is anticipated that the expandable data center 100 be composed of more than two movable containers that are collected together. The movable container 102 has a larger space to include the container 104. That is, when the expandable data center 100 is transported from a first location to a second location, the movable container 104 is collected into the movable container 102, as shown in FIG. 1. When the expandable data center 100 is moved to a designated location, e.g. a predetermined geographic location, the movable container 104 is expanded out from the movable container 102 for operation (as shown in FIGS. 2 to 4). In one embodiment of the present invention, the movable containers 102 and 104 are standard shipping containers that are used to transport goods on ships, trains, trucks, or other vehicles. For example, as shown in FIG. 1, a vehicle such as a container truck 106 carries the movable containers 102 and 104.

In the embodiment as illustrated in FIG. 2, the movable container 104 is slid vertically or along the "y-direction" from an upper side of the movable container 102 for operation when the expandable data center 100 is moved to a designated location.

In the embodiment as illustrated in FIG. 3, the movable container 104 is slid horizontally or along the "x-direction" out from a rear side of the movable container 102 when the expandable data center 100 is moved to a designated location. One or more support legs 105, which are pivotally connected with a corner or edge of the movable container 104, are swiveled upright to uphold the movable container 104 such that the container 104 can be reliably supported. The support legs 105 can be swiveled back to a bottom side of the movable container 104 when the movable container 104 is slid into the movable container 102.

In the embodiment as illustrated in FIG. 4, two movable containers 104a and 104b are slid horizontally out from two opposite lateral sides of the movable container 102 when the expandable data center 100 is moved to a designated location. A plurality of support legs 105, which are pivotally connected with a corner or edge of the movable container 104, are swiveled upright to uphold the movable container 104 such that the container 104 can be reliably supported. The support legs 105 can be swiveled back to a bottom side of the movable container 104 when the movable container 104a and/or 104b is slid into the movable container 102.

Figure 5:
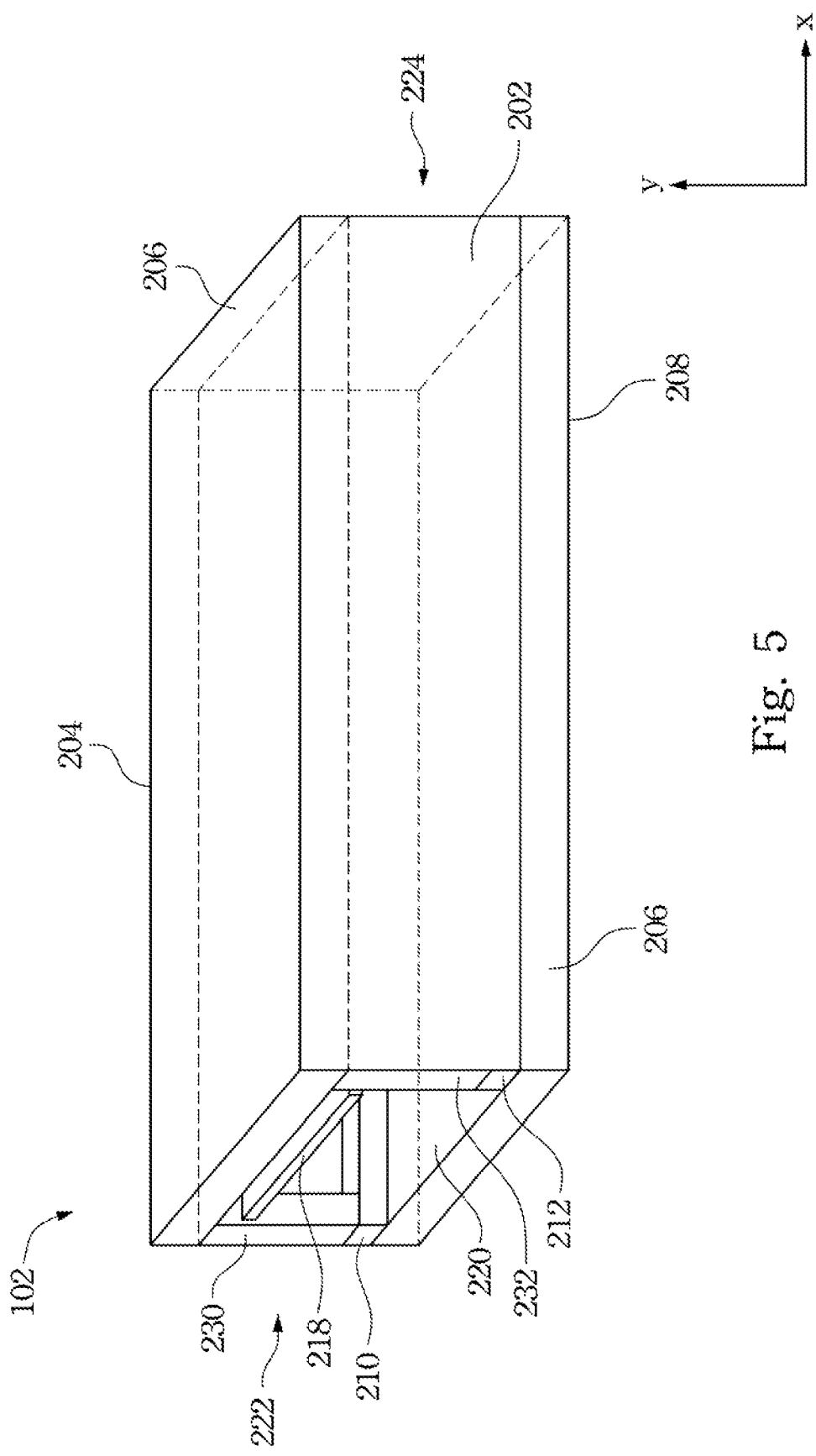
FIG. 5 illustrates a perspective view of a movable container according to the present invention.
Figure 5A:
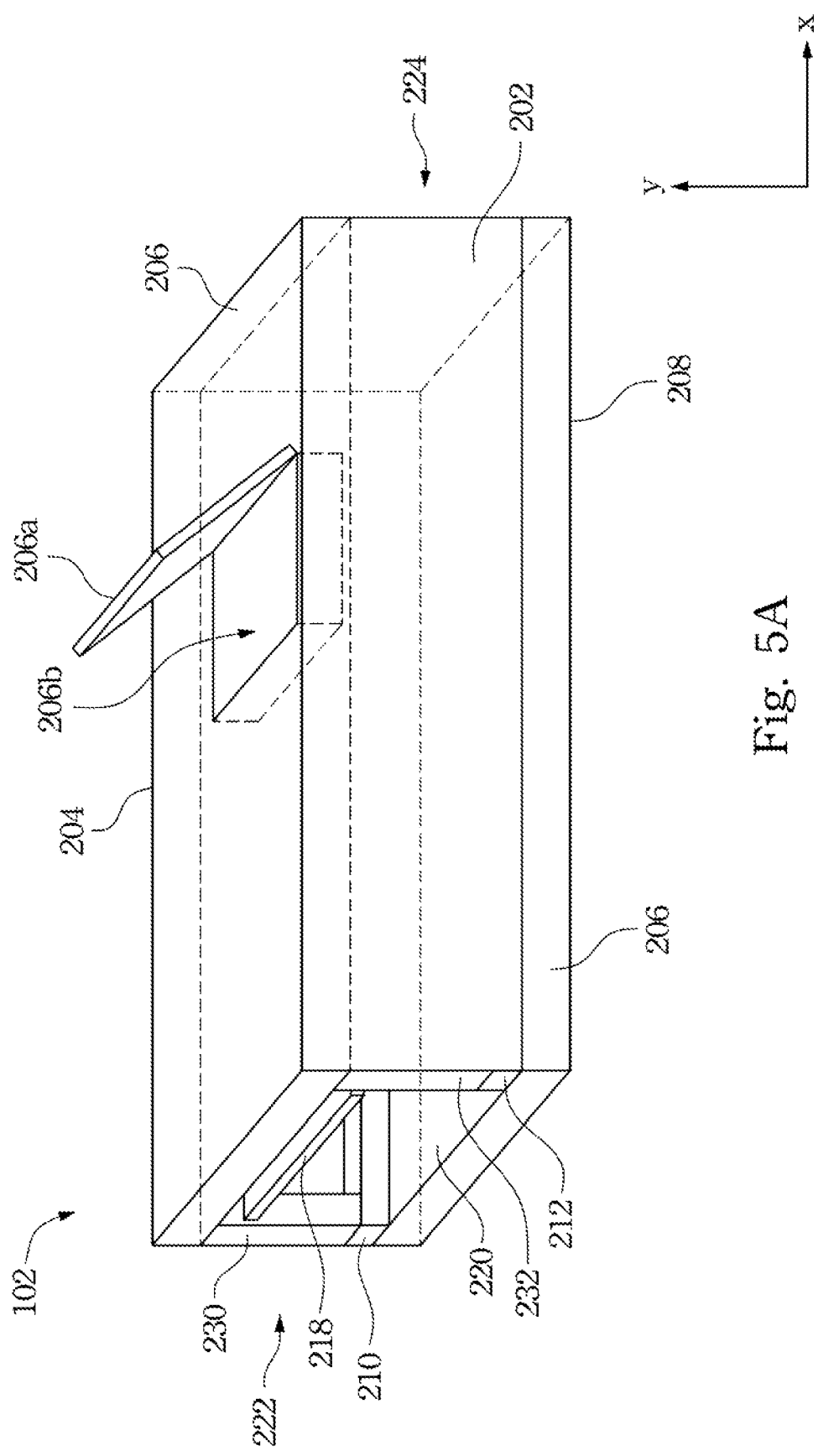
FIG. 5A illustrates a movable container having a top wall that includes a lid covering an opening formed in the top wall of the movable container.

FIG. 5 illustrates a perspective view of a movable container according to the present invention. The movable container 102 includes a first sidewall 202 and an opposite sidewall 204 that are joined on their upper edges to a top wall 206. A base 208 adjoins the bottom of the sidewalls 202 and 204. An adjustable ceiling 218 and an adjustable floor 220 are provided within the movable container 102. The ceiling 218 and the floor 220 can be raised or lowered in response to the environmental condition outside the movable containers 102. For example, the ceiling 218 is moved downward to spare a larger space between the ceiling 218 and the top wall 206 when the temperature outside the movable containers 102 is relatively high. The spare room provides a better heat isolation between the inside of the movable containers and the environment outside the movable containers 102. Similarly, the floor 220 may be moved upward to spare a larger space between the floor 220 and the base 208 when the temperature outside the movable containers 102 is relatively high so that the spare room provides a better heat isolation from the environment outside the movable containers 102. Moreover, multiple rails 210 and 212 may be installed on the floor 220 such that the movable container 104 may move in or out of the movable container 102 along the x-direction. In one embodiment of the present invention, the rails 230 and 232 are installed in the two sidewalls 202 and 204, respectively, so as to move the movable container 104 along the y-direction. The movable container 102 has a front end 222 and a back end 224 that are provided with doors (not shown). In an embodiment, the movable container 104 may move in or out of the movable container 102 from either the front end 222 or the back end 224. As shown in FIG. 5A, the top wall 206 may comprise a lid 206a covering an opening 206b formed in the top wall 206. The opening 206b facilitates convection between the interior of the movable container 102 and the environment outside the movable container 102. The lid 206a is pivotally connected with the top wall 206 such that the lid 206a can be swiveled to selectively cover or expose the opening 206b. The size of the lid 206a and opening 206b can be designed to meet the desired convection requirement.

Figure 6:
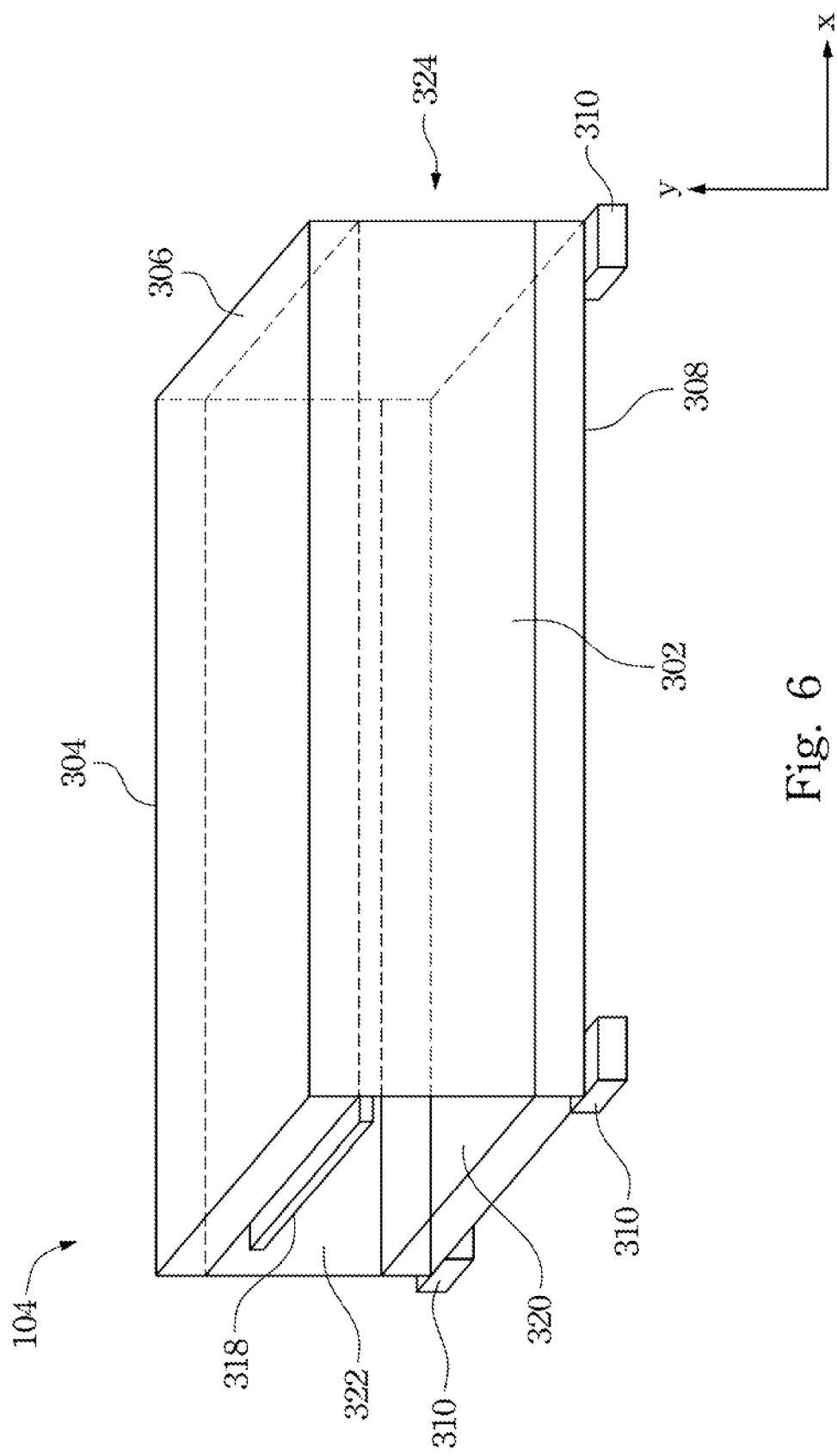
FIG. 6 illustrates a perspective view of another movable container according to the present invention.
Figure 6A:
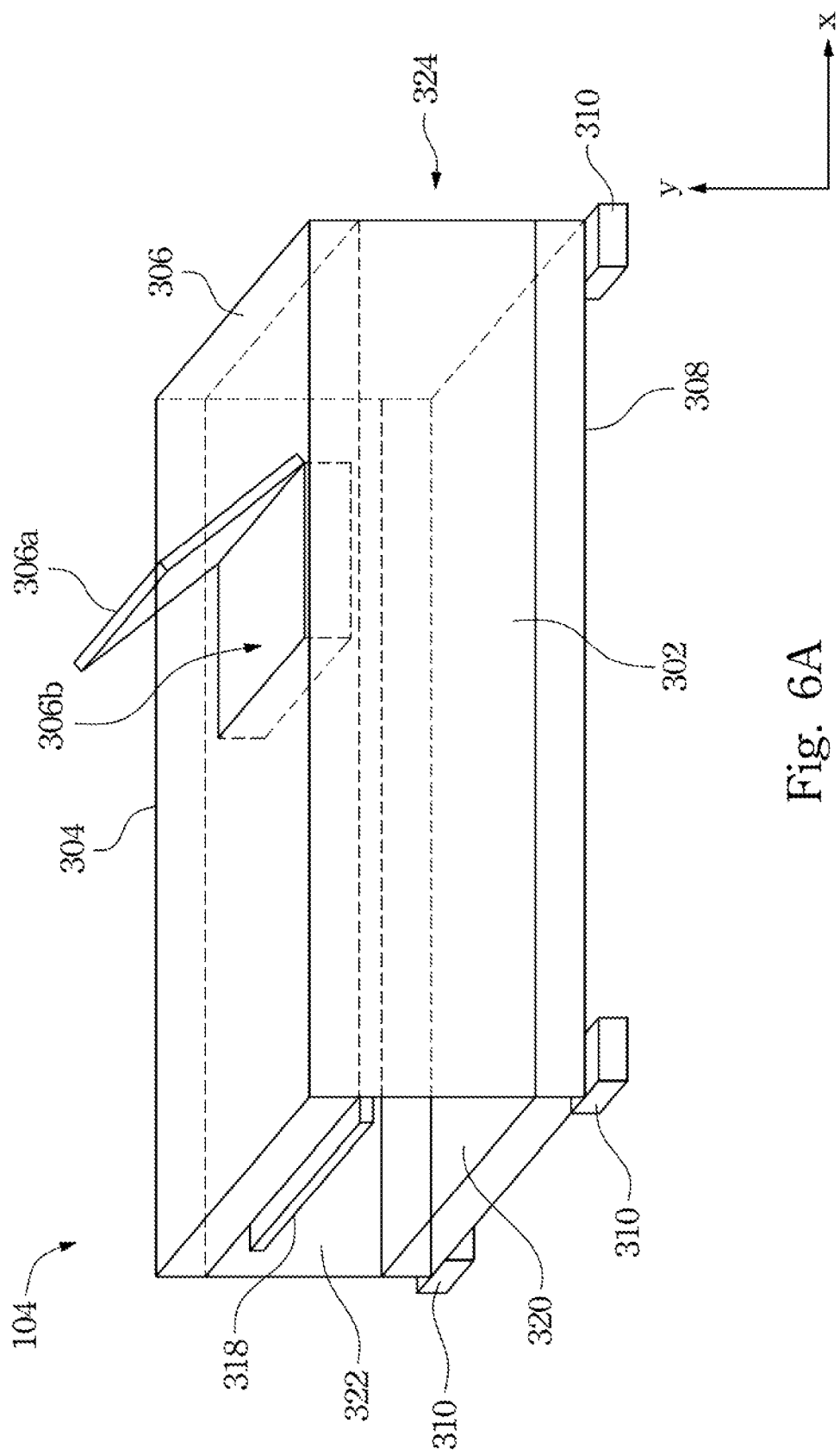
FIG. 6A illustrates another movable container having a top wall that includes a lid covering an opening formed in the top wall of the another movable container.

FIG. 6 illustrates a perspective view of a movable container according to the present invention. The movable container 104 includes two sidewalls 302 and 304 on opposite sides that are joined on their upper edges to a top wall 306. A base 308 adjoins the bottom of the sidewalls 302 and 304. An adjustable ceiling 318 and an adjustable floor 320 are provided within the movable containers 104. The ceiling 318 and the floor 320 can be raised or lowered concurrently or separately, based on one or more environmental parameters outside the movable containers 104. For example, the ceiling 318 may be moved downward to spare room between the ceiling 318 and the top wall 306 when the temperature outside the movable containers 104 is relatively high. This larger space provides a better heat isolation from the environment outside the movable containers 104. Similarly, the floor 320 may be moved upward to spare room between the floor 320 and the base 308 when the temperature outside the movable containers 104 is relatively high. This larger space provides a better heat isolation from the environment outside the movable containers 104. The movable container 104 has a front end 322 and a back end 324 that are provided with doors (not shown). Moreover, as shown in FIG. 6, a plurality of sliders 310 are installed beneath the base 308 to cooperate with the rails 210, 212, 230 and 232 of the movable container 102 (FIG. 5) to move the movable container 104. According to an embodiment of the present invention, the movable container 104 is moved along the x-direction by sliding the sliders 310 on the rails 210 and 212 of the movable container 102. The movable container 104 is moved along the y-direction by sliding the sliders 310 on the rails 230 and 232, as shown in FIG. 5. As shown in FIG. 6A, the top wall 306 may comprise a lid 306a covering an opening 306b formed in the top wall 306. The opening 306b facilitates convection between the interior of the movable container 104 and the environment outside the movable container 104. The lid 306a is pivotally connected with the top wall 306 such that the lid 306a can be swiveled to selectively cover or expose the opening 306b. The size of the lid 306a and opening 306b can be designed to meet the desired convection requirement.

FIG. 7 illustrates a cross-sectional view of a movable container 104 slid vertically along the y-direction. The movable container 104 is moved along the y-direction by sliding the sliders 310 on the rails 230 and 232.

Figure 8:
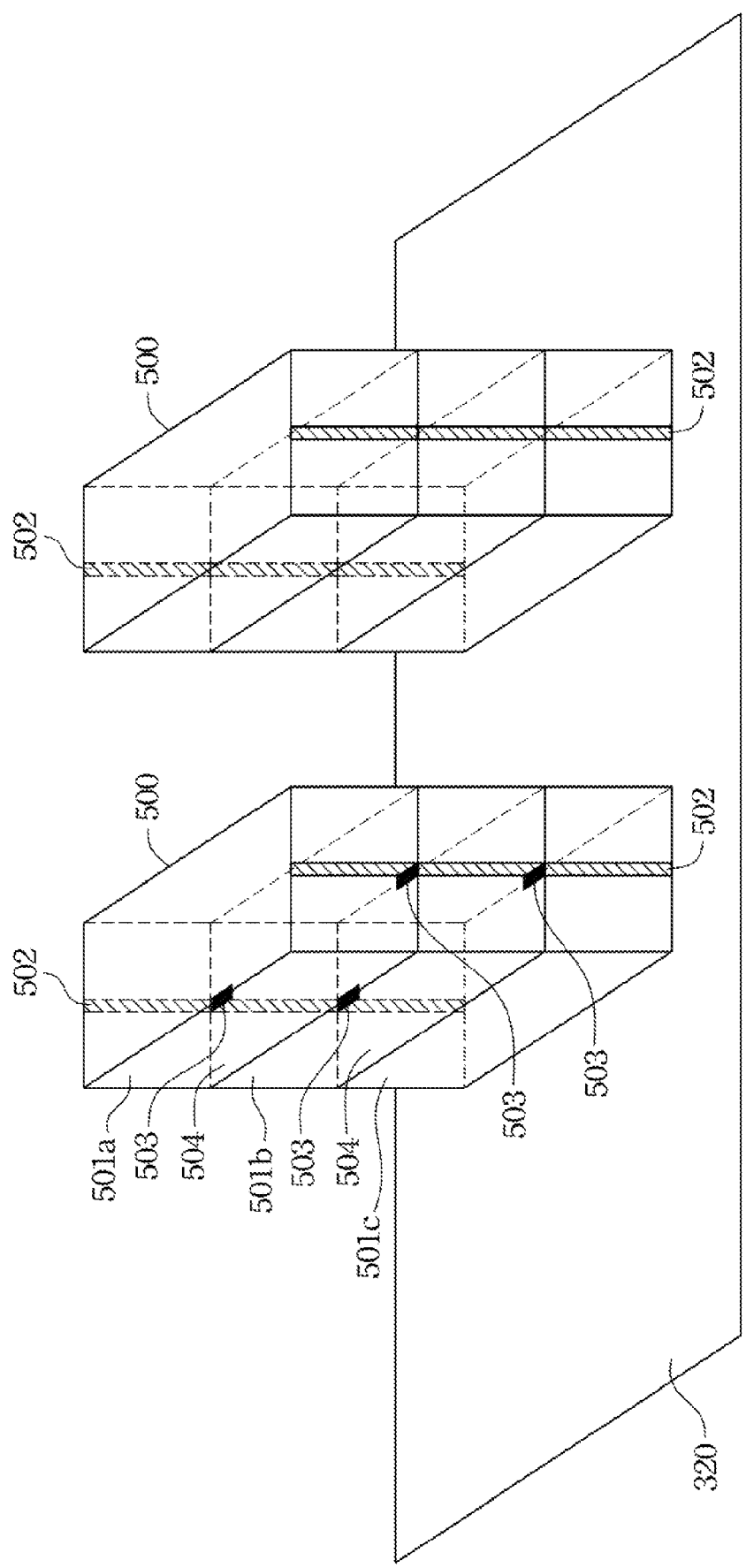
FIG. 8 illustrates a rack structure within a movable container according to the present invention.

FIG. 8 illustrates a rack structure within a movable container according to the present invention. Inside the movable container 104, a plurality of racks 500 are assembled on the floor 320. Each of the racks 500 includes a plurality of rack shelves 501a, 501b and 501c on which computer modules and/or servers (not shown) may be placed. Each of the rack shelves 501a, 501b and 501c has a movable chassis 504. For example, the pair of rails 502 are installed in each rack 500. Sliders 503 are installed in each chassis 504 so that the chassis 504 can slide along the rails 502. According to an embodiment of the present invention, the chassis 504 can be raised or lowered so as to facilitate heat dissipation of the computer modules or servers located on the chassis. For example, the chassis 504 of the rack shelve 501a may be moved toward the floor 320 to spare room between two chassis 504 when the operation temperature of the computer module located in the rack shelve 501a is relatively high. This larger space facilitates heat dissipation of one or more computer modules located in the rack shelve 501a. On the other hand, the chassis 504 of the rack shelve 501a may be moved toward the ceiling 318 to spare room for the rack shelve 501b when the operation temperature of the computer modules located in the rack shelve 501b is relatively high. This larger space facilitates the computer modules located in the rack shelve 501b to effectively dissipate heat.

Figure 9:
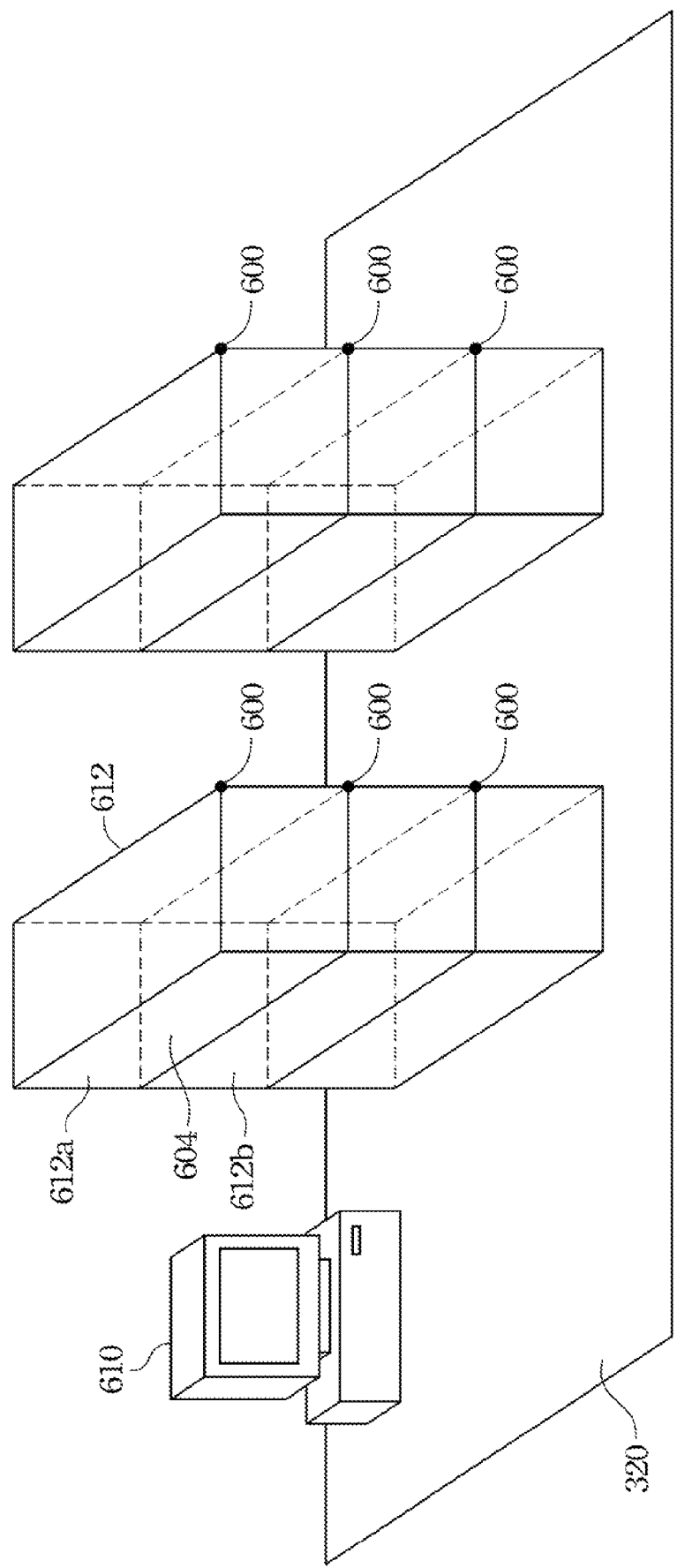
FIG. 9 illustrates a sensor system for collecting environmental parameters, according to the present invention.

FIG. 9 illustrates a sensor system for collecting environmental parameters, according to the present invention. The sensor system may include sensors and/or detectors. The sensor system includes a management system 610 and a plurality of sensors 600 installed in computer racks 500 (as illustrated in FIG. 8). Since the temperature profile of air throughout the racks 500 is typically non-uniform, multiple sensors 600 may be implemented to capture temperature data at multiple locations. In order to get an accurate profile of temperature or other conditions such as humidity, any number of sensors can be deployed on or near each rack 500. As shown in FIG. 9, each rack 500 includes three sensors 600, for example. According to an embodiment of the present invention, sensors 600 may sense environmental conditions or parameters such as, but not limited to, temperature, humidity, air pressure, air velocity, smoke, occupancy, rack door condition, sound, and light. The management system 610 is configured to communicate with the sensors 600 by wired or wireless means to process the environmental parameters sensed and/or detected by the sensors 600. Each sensor 600 has an identification associated with its position. That is, the management system 610 may identify the position where one or more corresponding environmental parameters are sensed, based on the respective sensor identification.

As shown in the FIG. 9, according to an embodiment of the present invention, when the management system 610 identifies a rack shelve, such as the rack shelve 612a of to the first rack 612, whose environmental parameter, such as temperature, is higher than adjacent rack shelve 612b, the space arrangement of the rack shelve 612a and the rack shelve 612b will be rearranged or relocated. For example, the chassis 604 of the rack shelve 612a may be moved toward the floor 320 to spare more room for the rack shelve 612a. The spare room facilitates the computer module located beside the rack shelve 612a to dissipate heat.

In another embodiment of the present invention, when the management system 610 identifies that an environmental parameter associated with the movable container 102, such as temperature, is higher than a predetermine threshold value, the ceiling 218 and the floor 220 are raised or lowered to change the space between the ceiling 218 and the top wall 206 and/or between the floor 220 and the base 208, as shown in FIG. 5. This mechanism is to utilize the outside environment to lower the temperature in the movable container, and therefore it is more cost effective by saving energy incurred by air cooling mechanism.

Figure 10:
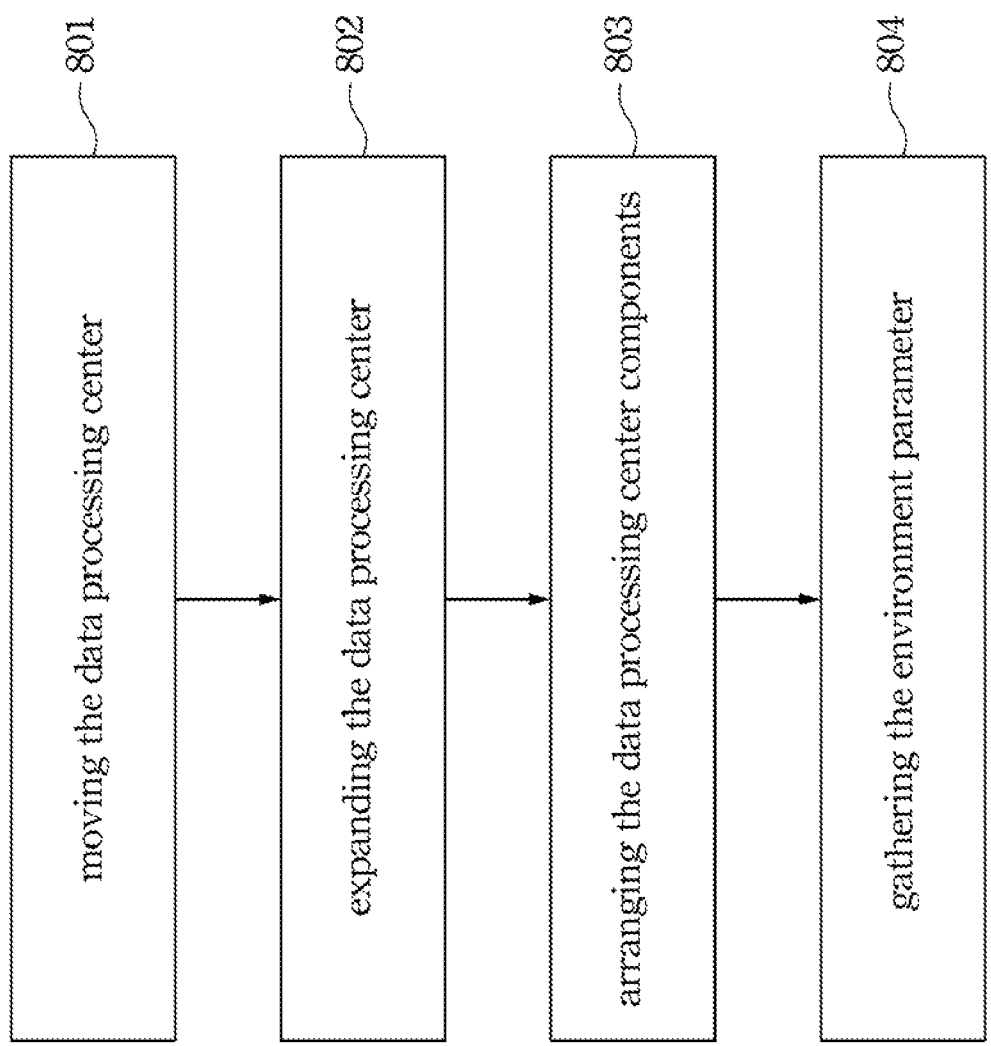
FIG. 10 is a flow chart showing the method for utilizing an expandable data center according to the present invention.

FIG. 10 is a flow chart showing the method for utilizing an expandable data center according to the present invention. In an embodiment, when it is desirable to deploy a transportable data center, a movable data center is transported to the desired area (step 801). Then, the movable data center is expanded (step 802). For example, a relatively smaller container is horizontally or vertically slid out from a larger container as illustrated in FIGS. 2 to 4. Next, the components or modules in the data center are arranged (step 803). For example, the computer modules beside the rack shelves are arranged according to a predetermined layout. Finally, the environmental parameters corresponding to the data center are gathered, to rearrange or relocate the space of the rack shelves or the space between the ceiling and the top wall or between the floor and the base (step 804).

Figure 11:
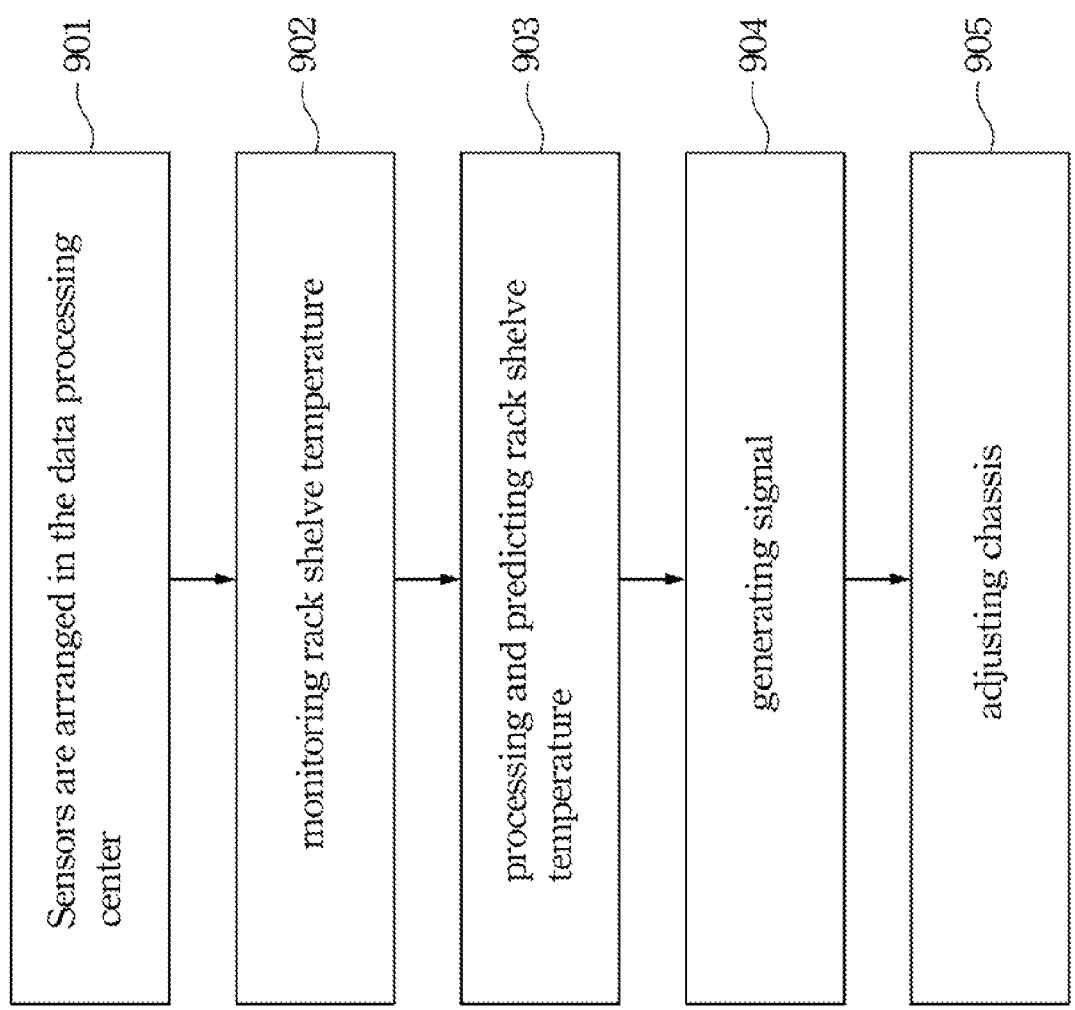
FIG. 11 is a flow chart showing a method for rearranging space of rack shelves based on gathered environmental parameters, according to the present invention.

FIG. 11 is a flow chart showing a method for rearranging space of rack shelves based on gathered environmental parameters, according to the present invention. First, a plurality of sensors are installed in a data center (step 901). For example, the sensors are installed in computer racks of the data center. Each rack shelve in a rack has a sensor. The sensors monitor the temperature of the respective rack shelves (step 902). Then, the temperature detected by the sensors is processed and predicted (step 903). Processing the temperature is to convert and sort the temperature detected by the sensors. Predicting the temperature is to compare the temperature detected by the sensors with prior temperature data so as to predict a temperature. Then, the predicted temperature is used to determine whether or not to enlarge or narrow the space defined by a corresponding rack shelf. A signal is generated to control the movement of a chassis (step 904). Finally, the chassis is moved in response to the signal (step 905).

Figure 12:
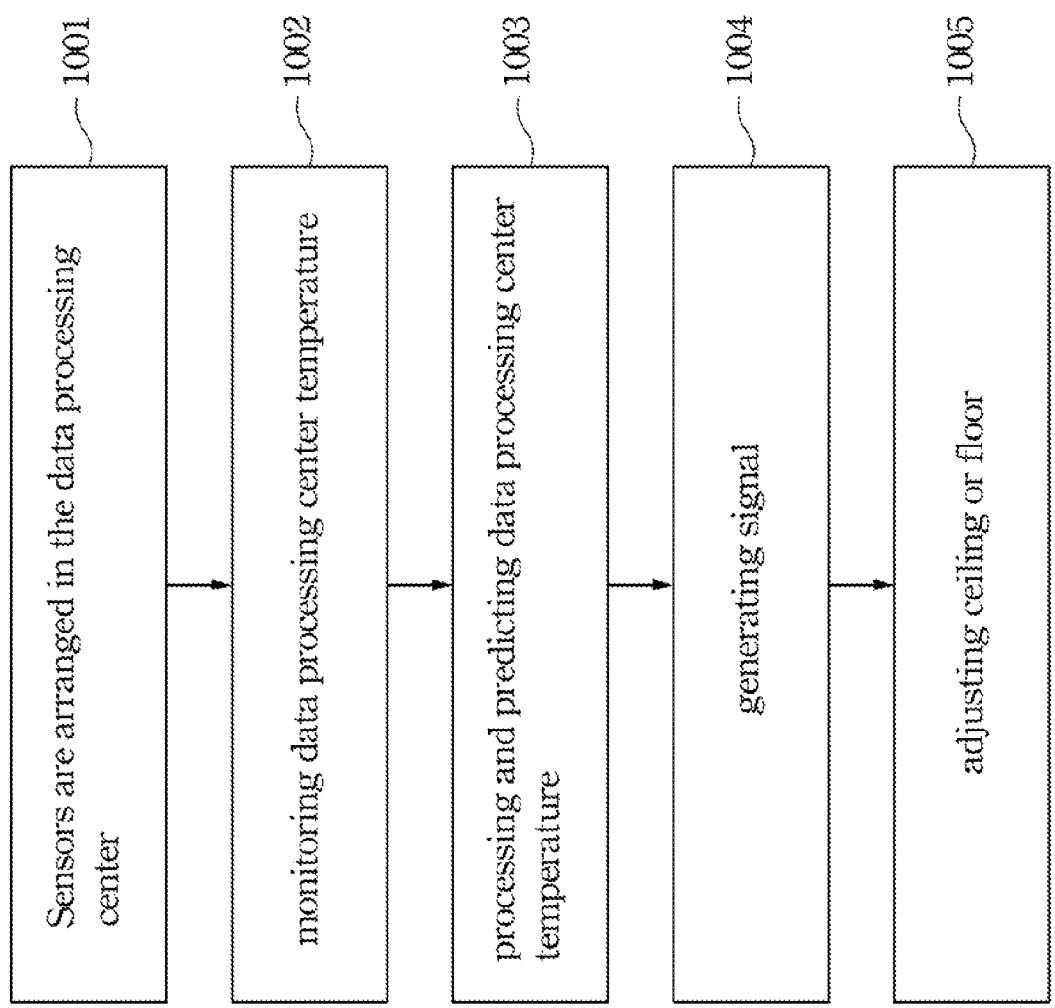
FIG. 12 is a flow chart showing rearrangement of space between a ceiling and a top wall or between a floor and a base, based on one or more gathered environmental parameters, according to the present invention.

FIG. 12 is a flow chart showing a method for rearranging space between a ceiling and a top wall or between a floor and a base based on one or more environmental parameters, according to the present invention. First, a plurality of sensors are installed in a data center (step 1001). The sensors monitor the temperature in the data center (step 1002). Then, the temperature data collected by the sensors are processed and predicted (step 1003). Processing the temperature data is to convert and sort the temperature data detected by the sensors. Predicting the temperature is to compare the temperature detected by the sensors with prior temperature data to predict a temperature. Then, the predicted temperature is used to determine whether or not to enlarge or narrow a space between the ceiling and the top wall or between the floor and the base. A signal is generated to control the movement of the ceiling and/or the floor (step 1004). Finally, the ceiling and/or the floor is moved in response to the signal (step 1005).

According to an embodiment of the present invention, a number of sensors are deployed at various locations throughout the expandable data center to dynamically collect environmental data. By dynamically collecting environment data at various locations within the data center, the space of rack shelves or the space between a ceiling and a top wall or between a floor and a base can be rearranged before cooling resources, if any, are allocated. As a result, substantial savings in operational costs related to the operation of the data center cooling resources is achieved.

Although the present invention has been described in considerable detail with reference to certain embodiments thereof, other embodiments are possible. Therefore, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the appended claims.

What is claimed is:

1. An expandable data center comprising:
    a vehicle;
    a first movable container;
    a second movable container coupling with the first movable container, wherein the size of the second movable container is less than that of the first movable container, so that the second movable container is adapted to extend or retract from the first movable container, wherein the vehicle is adapted to carry the first movable container and the second movable container from a place to another place;
    a plurality of racks disposed within the first movable container and the second movable container, wherein each of the racks has a plurality of rack shelves; and
    a plurality of sensors, disposed within the first movable container and the second movable container, for sensing one or more environmental parameters in the first movable container and the second movable container, respectively, wherein each of the rack shelves comprises a chassis, wherein the chassis is controlled to move up or down based on at least one of the environmental parameters sensed by the sensors.

2. The expandable data center of claim 1, wherein the first movable container comprises a ceiling, wherein the ceiling is controlled to move up or down based on at least one of the environmental parameters.

3. The expandable data center of claim 2, wherein the first movable container comprises a top wall having a lid that covers an opening formed in the top wall of the first movable container.

4. The expandable data center of claim 1, wherein the first movable container comprises a floor, wherein the floor is controlled to move up or down based on at least one of the environmental parameters.

5. The expandable data center of claim 1, wherein the second movable container comprises a ceiling, wherein the ceiling is controlled to move up or down based on at least one of the environmental parameters.

6. The expandable data center of claim 5, wherein the second movable container comprises a top wall having a lid that covers an opening formed in the top wall of the second movable container.

7. The expandable data center of claim 1, wherein the second movable container comprises a floor, wherein the floor is controlled to move up or down based on at least one of the environmental parameters.

8. The expandable data center of claim 1, wherein the one or more environmental parameters comprise temperature, humidity, air pressure, air velocity, smoke, occupancy, rack door condition, sound, and light.

9. The expandable data center of claim 1, wherein the first movable container further comprises first rails disposed along a first direction and second rails disposed along a second direction, the second movable container is comprises sliders, wherein the second movable container is moved along the first direction by sliding the sliders on the first rails, and the second movable container is moved along the second direction by sliding, the sliders on the second rails.

10. The expandable data center of claim 9, wherein the first direction and the second direction are perpendicular to each other.

11. A method for deploying a data center, comprising:
providing a first movable container;
providing a second movable container coupling with the first movable container, wherein the size of the second movable container is less than that of the first movable container, so that the second movable container is adapted to be moved into the first movable container;
disposing a plurality of racks within the first movable container and the second movable container, wherein each of the rack has a plurality of rack shelves;
disposing a plurality of sensors within the first movable container and the second movable container for sensing one or more environmental conditions in the first movable container and. the second movable container, respectively;
gathering the environmental conditions and comparing the environmental conditions with prior environmental conditions data to generate a control signal; and
providing a movable chassis in at least one of the rack shelves, wherein the chassis is controlled to move up or down in response to the control signal.

12. The method of claim 11, further comprising providing, a movable ceiling in the first movable container, wherein the ceiling is controlled to move up or down in response to the control signal.

13. The method of claim 11, further comprising providing a movable floor in the first movable container, wherein the floor is controlled to move up or down in response to the control signal.

14. The method of claim 11, further comprising providing a movable ceiling in the second movable container, wherein the ceiling is controlled to move up or down in response to the control signal.

15. The method of claim 11, further comprising providing a movable floor in the second movable container, wherein the floor is controlled to move up or down in response to the control signal.

16. The method of claim 11, further comprising providing first rails along a first direction and providing second rails along a second direction in the first movable container.

17. The method of claim 16, further comprising providing sliders in the second movable container, wherein the second movable container is moved along the first direction by sliding the sliders on the first rails and the second movable container is moved along the second direction by sliding the sliders on the second rails.

18. The method of claim 16, wherein the first direction and the second direction are perpendicular to each other.

* * * * *